US008957569B2

(12) United States Patent
Yamaguchi et al.

(10) Patent No.: US 8,957,569 B2
(45) Date of Patent: Feb. 17, 2015

(54) GT-CUT QUARTZ CRYSTAL RESONATOR

(75) Inventors: Takashi Yamaguchi, Sayama (JP); Hiroaki Yamada, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 529 days.

(21) Appl. No.: 13/372,373

(22) Filed: Feb. 13, 2012

(65) Prior Publication Data

US 2012/0212107 A1  Aug. 23, 2012

(30) Foreign Application Priority Data

Feb. 23, 2011  (JP) ................................ 2011-037086
Nov. 8, 2011  (JP) ................................ 2011-244672

(51) Int. Cl.
*H01L 41/053*  (2006.01)
*H01L 41/09*   (2006.01)

(52) U.S. Cl.
USPC .......................... 310/360; 310/348; 310/367

(58) Field of Classification Search
CPC .................................................. G01C 19/5607
USPC ........... 310/357, 360, 367, 369, 348; 117/71, 117/72
See application file for complete search history.

(56) References Cited

U.S. PATENT DOCUMENTS

| 5,323,083 | A  | * | 6/1994  | Smythe et al. | ................. 310/351 |
| 7,834,526 | B2 | * | 11/2010 | Yamada        | ......................... 310/367 |
| 2008/0252178 | A1 | * | 10/2008 | Yamada        | ......................... 310/361 |
| 2012/0038431 | A1 | * | 2/2012  | Jaakkola et al. | ............... 331/155 |
| 2013/0082573 | A1 | * | 4/2013  | Kuroda et al. | ................. 310/348 |

FOREIGN PATENT DOCUMENTS

| JP | 03-150911 A   | 6/1991  |
| JP | 09-246898     | 9/1997  |
| JP | 2001-313537 A | 11/2001 |
| JP | 2004-135357 A | 4/2004  |
| JP | 2007-158486   | 6/2007  |

OTHER PUBLICATIONS

Kawashima et al., Quartz resonators and devices, Transactions of the Institute of Electronics, Information and Communication Engineers C-I, Dec. 1999, pp. 667-682, vol. J82-C-I, No. 12, Japan.
Kawashima et al., Miniaturized GT-cut quartz resonators, The Horological Institute of Japan, 1983, pp. 36-48, vol. 104, Japan.
Office Action mailed Jul. 15, 2014 in corresponding JP application No. 2011-037086 with partial translation.

* cited by examiner

*Primary Examiner* — Thomas Dougherty
(74) *Attorney, Agent, or Firm* — Knobbe Martens Olson & Bear LLP

(57) ABSTRACT

A GT-cut crystal resonator that can be provided with a support portion having a small and simple configuration without adverse effect on vibration characteristics includes: a crystal plate formed in an elliptical shape with a major axis and a minor axis respectively corresponding to vibration directions of two longitudinal vibration modes orthogonal to each other in a GT-cut; and a support portion that supports the crystal plate, the support portion being connected to a position on an outer periphery of the crystal plate where a minimum vibration displacement is obtained when the two longitudinal vibration modes are coupled.

13 Claims, 6 Drawing Sheets

GT-CUT QUARTZ CRYSTAL RESONATOR

BACKGROUND OF THE INVENTION

1. Field of the Invention

The present invention relates to a GT-cut quartz crystal resonator.

2. Description of the Related Art

Crystal resonators for use as a reference source for a frequency or time are classified into several types of "cut" depending on a crystallographic orientation obtained when a crystal plate or crystal blank, i.e., a vibrating plate constituting a crystal resonator, is cut out from a single crystal of quartz (see, for example, Hirofumi Kawashima, Koichi Hirama, Naoya Saito, and Mitsuaki Koyama, "Quartz Resonators and Devices", *Transactions of the Institute of Electronics, Information and Communication Engineers C-I*, Vol. J82-C-I, No. 12, pp. 667 to 682, December 1999). An AT-cut and an SC-cut have been widely known as examples of such a "cut". Among them, a GT-cut crystal blank has an excellent frequency-temperature characteristic and shows an extremely small change in resonance frequency when the ambient temperature is changed. For this reason, the GT-cut crystal blank is expected to be applied to a crystal oscillator with high accuracy and high stability, for example. In addition, the GT-cut crystal resonator has advantages that it can be configured in a small size even when the resonance frequency thereof is low.

As widely known, three crystal axes of an X-axis, a Y-axis, and a Z-axis are crystallographically defined in quartz. A crystal plate cut out along a plane orthogonal to the Y-axis is called a "Y-plate". The plane orthogonal to the Y-axis is a surface parallel to the X-axis and the Z-axis. A GT-cut crystal plate is of a quartz plate formed such that the Y-plate is rotated around the X-axis by +51.5° (i.e., $\phi=+51.5°$) and the plate is rotated within the plane of the plate by +45° (i.e., $\theta=+45°$). Angles "$\phi$" and "$\theta$" are parameters generally used to specify the cut orientation of quartz. FIG. 1 illustrates cut orientation 12 obtained when a GT-cut crystal plate is cut out from a single crystal quartz, i.e., raw stone 11. For reference, FIG. 1 also illustrates cut orientations of typical cuts other than the GT-cut. In order to specify the orientations within the GT-cut crystal plate, axes obtained by allowing the X-axis, the Y-axis, and the Z-axis to rotate around the X-axis by +51.5° are respectively defined as an X'-axis, a Y'-axis, and a Z'-axis. Since the X'-axis is obtained by allowing the X-axis to rotate about the X-axis, the X'-axis is identical with the X-axis. Axes obtained by allowing the X'-axis and the Z'-axis to rotate around the Y'-axis by 45° in the direction from the Z'-axis to the X'-axis are respectively defined as an X"-axis and a Z"-axis.

A vibration mode in the GT-cut crystal plate will now be described. As illustrated in FIG. 2, a vibration mode in GT-cut crystal plate 21 is a combined vibration mode of a longitudinal vibration mode in an X"-axis direction and a longitudinal vibration mode in a Z"-axis direction. Both of the longitudinal vibration modes in the X"-axis direction and the Z"-axis direction are a length-extensional vibration mode. Vibration modes obtained by combining these two longitudinal vibration modes are also called "a width-length extensional coupling vibration mode". In the figures, length-extensional vibration directions are indicated by arrows, and an outline displaced by vibration is indicated by dotted lines. In this case, however, the displaced outline is illustrated as an outline with a much larger displacement than an actual displacement in crystal plate 21, for convenience of illustration. Because of such a coupled vibration mode of the two longitudinal vibration modes, the GT-cut crystal plate of the related art is formed in a rectangular shape or a square shape with one pair of sides in parallel with the X"-axis and the other pair of sides in parallel with the Z"-axis to use as a vibrating plate, i.e., a crystal blank, in the crystal resonator. Both principal surfaces of the crystal plate are provided with excitation electrodes for exciting the crystal plate serving as a vibrating plate.

In the case of using a GT-cut crystal plate as a vibrating plate, i.e., crystal blank, constituting a crystal resonator, it is necessary to hold the crystal plate within a container so as not to contact a wall surface or the like of the container of the crystal resonator. In view of this, a technique is proposed in which a main portion of a vibrating plate i.e., a vibration part, and a support portion for supporting the vibration part are integrally formed from a plate-shaped member a quartz crystal by using photolithography technique (see, JP-9-246898A; and Hirofumi Kawashima, Osamu Ochiai, Akihito Kudo, and Atsunobu Nakajima, "Miniaturized GT-Cut Quartz Resonators" *The Horological Institute of Japan*, Vol. 104, pp. 36-48, 1983). In this case, as illustrated in FIG. 3, support portions 22 are connected to positions of middle points on a pair of opposed sides in the main portion of a rectangular shape in crystal plate 21 serving as a vibrating plate. The shape of each support portion 22 is designed by using a finite element method or the like so that a resonance frequency of the vibration part itself is substantially the same as a resonance frequency of the entire resonance system including support portions 22.

Note that the vibration mode of the quartz crystal plate is varied depending on the type of cut. For example, in the case of the AT-cut crystal plate which has been widely used, the vibration mode is a thickness-shear vibration mode, and the resonance frequency is determined only by the thickness. For this reason, the planar shape of the AT-cut crystal plate can be arbitrarily set. For example, as disclosed in JP-2007-158486A, the planar shape may be a circular or elliptical shape. In addition, a crystal blank of the AT-cut may be supported at a position corresponding to a stationary point of a thickness-shear vibration.

In the case of a GT-cut crystal blank, however, the vibration mode is the width-length extensional coupling vibration mode, which means that the resonance frequency changes depending on the planar shape and size of the width, length, and the like of the crystal blank, and vibrations in two vibration modes coupled together must be reliably generated. Therefore, it is impossible to arbitrarily set the planar shape and to arrange the support portion at an arbitrary position. In particular, there is generally no stationary point of a vibration displacement on an outer peripheral portion of a rectangular GT-cut crystal plate.

As described above, the GT-cut crystal plate has an excellent frequency-temperature characteristic, and is suitable for constructing a crystal oscillator with high stability and high accuracy. However, the GT-cut crystal blank of the related art has a rectangular shape, and the support portions are connected to the middle points on a pair of opposed sides. Since the vibration mode of the GT-cut crystal plate is the width-length extensional coupling vibration mode, the crystal plate is vibrated and displaced at the connected positions of the support portions, and the provision of the support portions may thus hinder vibration of the crystal plate. Attempts have been made to design each support portion using a finite element method so as to be formed in a shape that has no adverse effect on the vibration of the crystal plate. However, it is difficult to manufacture such support portions, because each support portion has a complicated shape. Further, the size of the support portion itself cannot be ignored in comparison to the size of the main portion of the vibrating plate. Therefore, a variation in dimensions of each support portion greatly affects the vibration characteristics of the crystal plate, and inhibits miniaturization of the crystal resonator.

SUMMARY OF THE INVENTION

It is an object of the present invention to provide a GT-cut crystal resonator which can be provided with a support portion having a small and simple configuration without adverse effect on vibration characteristics.

According to an aspect of the present invention, a GT-cut crystal resonator includes: a crystal plate formed in an elliptical shape with a major axis and a minor axis respectively corresponding to vibration directions of two longitudinal vibration modes orthogonal to each other in a GT-cut; and a support portion that supports the crystal plate, the support portion being connected to a position on an outer periphery of the crystal plate where a minimum vibration displacement is obtained when the two longitudinal vibration modes are coupled.

The GT-cut crystal plate, which is conventionally formed in a rectangular shape, is formed in an elliptical shape in the present invention. As described later, in the GT-cut crystal plate of the elliptical shape, there are four points where a minimum vibration displacement is obtained on an outer peripheral portion of the crystal plate. The support portion for supporting the crystal plate is connected to each of such points. According to the present invention, it is possible to support a crystal plate at a substantial stationary position for a vibration displacement and use a support portion having a small and simple configuration without adverse effect on vibration characteristics. Thus, it is possible to obtain a crystal resonator having an excellent temperature characteristic and high stability.

In the present invention, it is possible to arrange a plurality of GT-cut crystal plates in one crystal resonator. Such a GT-cut crystal resonator includes: a frame; a plurality of crystal plates having the same resonance frequency, each of the crystal plates being formed in an elliptical shape with a major axis and a minor axis respectively corresponding to vibration directions of two longitudinal vibration modes orthogonal to each other in a GT-cut; a pair of excitation electrodes respectively formed on both principle surfaces of each of the crystal plates; and a support portion provided for each of the crystal plates, the support portion supporting a corresponding crystal plate on the frame and being connected to a position on an outer periphery of the corresponding crystal plate where a minimum vibration displacement is obtained when the two longitudinal vibration modes are coupled, wherein the plurality of crystal plates are arranged in the same plane including vibration directions of the two longitudinal vibration modes, an outer periphery of one crystal plate of adjacent two of the crystal plates is mechanically coupled to an outer periphery of the other crystal plate of the adjacent two, and electric wirings are formed among the excitation electrodes so that, when the one crystal plate expands in a first direction, the other crystal plate expands in a second direction which is orthogonal to the first direction.

DETAILED DESCRIPTION OF THE EMBODIMENTS

Figure 4:
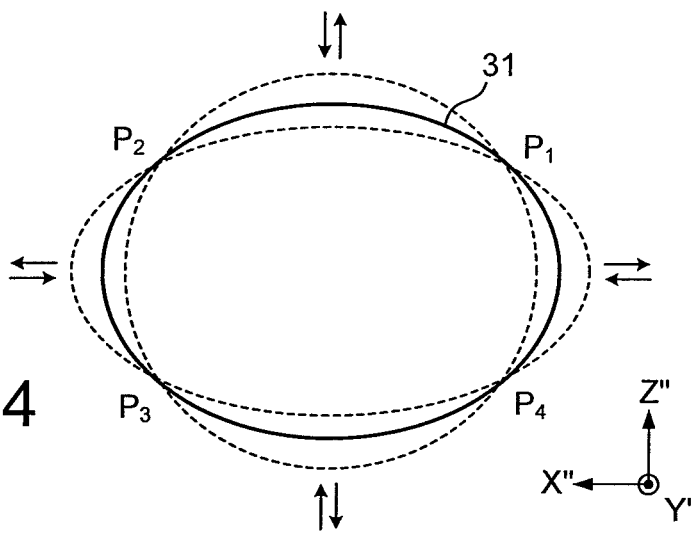
FIG. 4 is a diagram showing a fundamental configuration of a GT-cut crystal resonator according to a first embodiment of the present invention.

The quartz crystal resonator according to the first embodiment shown in FIG. 4 is identical with the crystal resonator of the related art described above in that GT-cut crystal plate 31 is used, but is different from the crystal resonator of the related art in that crystal plate 31 has an elliptic planar shape.

Figure 1:
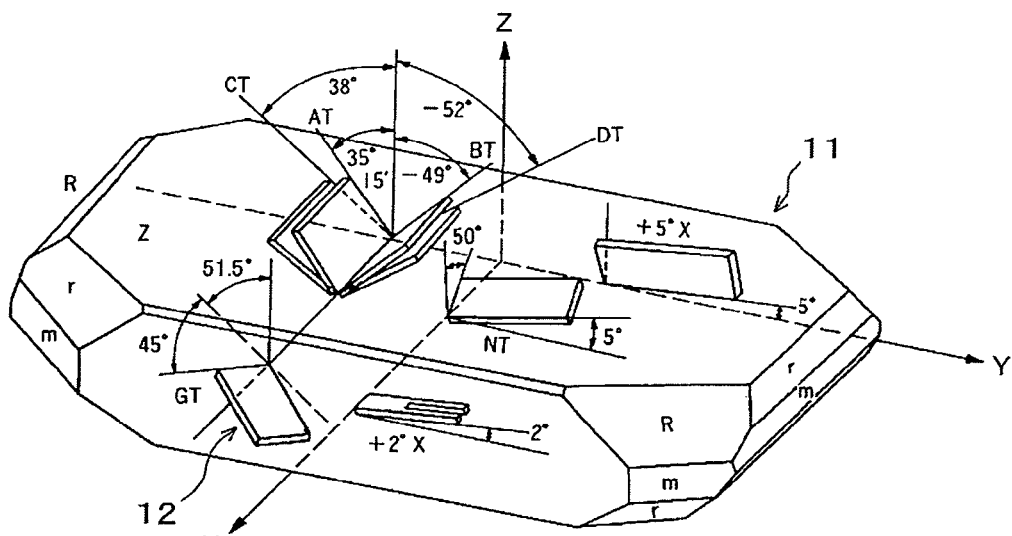
FIG. 1 is an explanatory diagram of a cut orientation of a GT-cut crystal plate.
Figure 2:
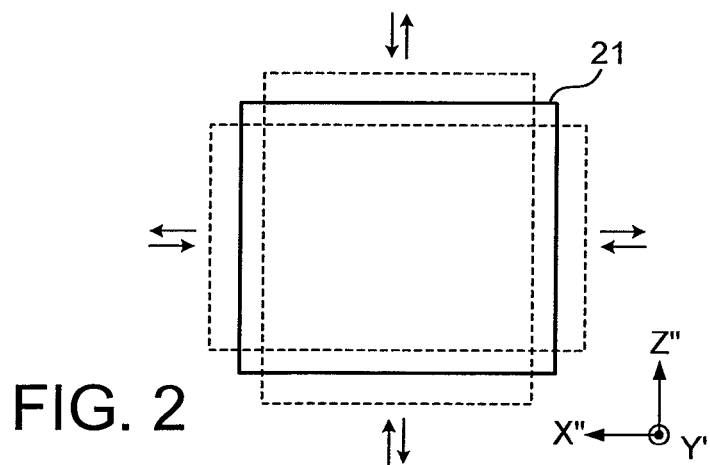
FIG. 2 is a plan view illustrating a vibration mode of the GT-cut crystal plate.
Figure 3:
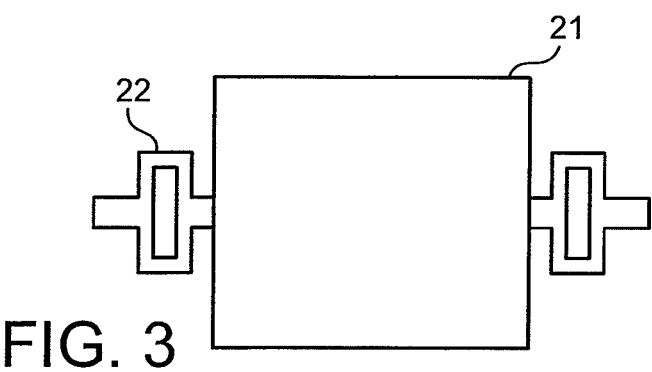
FIG. 3 is a plan view illustrating a square GT-cut crystal resonator of a related art provided with support portions.

Elliptical crystal plate 31 has a configuration in which the plate surface is orthogonal to a Y'-axis in a GT-cut; the major axis of the ellipse coincides with an X"-axis in the GT-cut; and the minor axis of the ellipse coincides with a Z"-axis. As a result, crystal plate 31 has, as a vibration mode, a width-length extensional coupling vibration mode which is a coupling of a longitudinal vibration mode in an X"-axis direction and a longitudinal vibration mode in a Z"-axis direction and which allows alternate expansion and contraction in the X"-axis direction and the Z"-axis direction, as with crystal plate 21 illustrated in FIG. 2. Referring to FIG. 4, the outline of crystal plate 31 displaced by vibration is emphasized by dotted lines. However, when an attention is paid to an outer peripheral portion of crystal plate 31, the magnitude of a vibration displacement is not constant at each point on the outer periphery. At points represented by $P_1$ to $P_4$ in the figure, the magnitude of the vibration displacement is minimum. Since elliptical crystal plate 31 alternately expands and contracts in the X"-axis direction serving as the major axis and the Z"-axis direction serving as the minor axis, there are always four points where a minimum vibration displacement is obtained on the outer periphery of crystal plate 31, i.e., on the ellipse.

Assuming that the amplitude of the vibration in each longitudinal vibration mode is sufficiently smaller than the size of crystal plate 31, points $P_1$ to $P_4$ are actual stationary points for the vibration displacement in the width-length extensional coupling vibration mode. Positions corresponding to the stationary points on the outer periphery of crystal plate 31 formed in an elliptical shape are varied depending on a ratio between length "a" of the major axis and length "b" of the minor axis of crystal plate 31. This ratio is an aspect ratio (b/a). For example, when the aspect ratio is 0.855, each stationary point is positioned in a direction in which an angle of 57.5° is formed from the major axis direction toward the minor axis direction when viewed from the center of crystal plate 31, i.e., the center of the ellipse.

In the crystal resonator of the first embodiment, support portions are connected to one or more of stationary points $P_1$ to $P_4$ of crystal plate 31, thereby making it possible to support crystal plate 31 without adverse effect on vibration characteristics of crystal plate 31. Since the support portions are connected to the stationary points in the vibration modes of crystal plate 31, there is no need to match the resonance frequency of the support portions with the resonance frequency of crystal plate 31, thereby simplifying the configuration of the support portions. For example, each support portion can be formed by a simple rod-shaped member or a beam member connected to the outer periphery of crystal plate 31. The use of GT-cut crystal plate 31 enables obtainment of an excellent frequency-temperature characteristic, and a combination of the crystal resonator and an oscillation circuit enables obtainment of a crystal oscillator with high accuracy and high stability.

Figure 5:
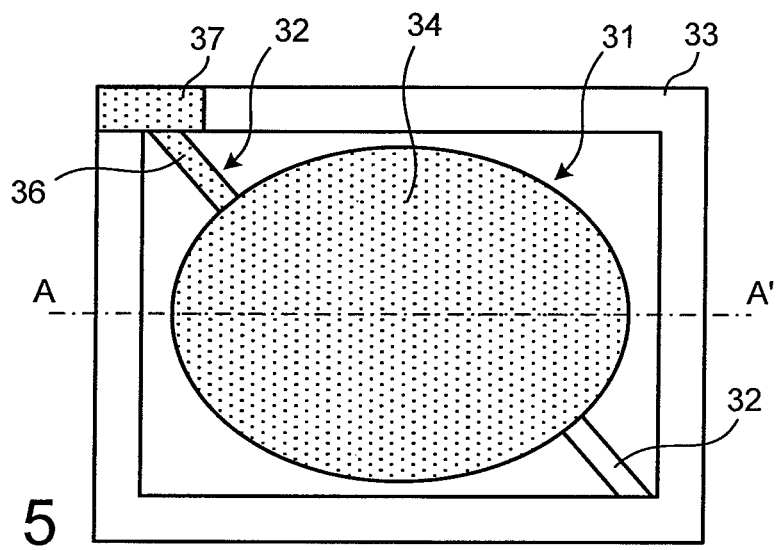
FIG. 5 is a plan view showing an example of a specific configuration of the crystal element according to the first embodiment.
Figure 6:
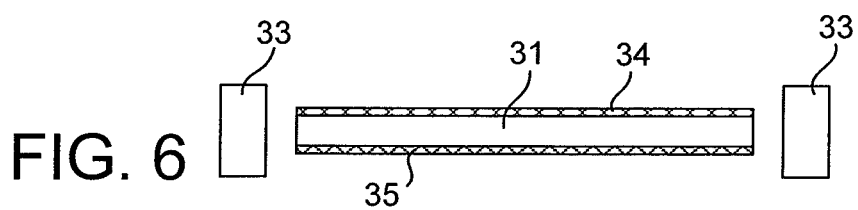
FIG. 6 is a sectional view taken along line A-A' of FIG. 5.

FIGS. 5 and 6 illustrate an example of a specific configuration of the crystal resonator according to this embodiment thus configured.

This crystal resonator includes frame 33 formed in a substantially rectangular shape, and holds elliptical GT-cut crystal plate 31 in an opening of frame 33. In the crystal resonator illustrated in FIGS. 5 and 6, elliptical crystal plate 31 has a plate surface orthogonal to the Y'-axis in the GT-cut. The major axis of the ellipse coincides with the X"-axis in the GT-cut, and the minor axis of the ellipse coincides with the Z"-axis. Crystal plate 31 is supported by two rod-shaped support portions 32 extending from the inner wall of frame 33. Two support portions 32 are mechanically connected to crystal plate 31 at two stationary points of above-mentioned four stationary points $P_1$ to $P_4$ located on the outer periphery of elliptical crystal plate 31. Herein, support portions 32 are connected to a pair of stationary points $P_2$ and $P_4$ (see FIG. 4) sandwiching the center of crystal plate 31, i.e., the center of the ellipse. The thickness of frame 33 is sufficiently greater than the thickness of crystal plate 31. Thus, when lid members are disposed on the upper surface and the lower surface of frame 33 and crystal plate 31 is housed in a space surrounded by frame 33 and the lid members, for example, crystal plate 31 is prevented from contacting the lid members.

Such a crystal resonator can be formed such that, for example, a plate-shaped member of quartz corresponding to a GT-cut is used and photolithography technology is applied to the plate-shaped member so that portions corresponding to crystal plate 31, support portions 32, and frame 33 are left and the other portions are removed. When the crystal resonator is formed by application of photolithography technology to the plate-shaped member of quartz, support portions 32 and frame 33 are formed of quartz and are integrally formed with crystal plate 31.

Additionally, excitation electrode 34 is formed on substantially the entire area of one principal surface of crystal plate 31, and extending electrode 36 for implementing electrical connection with excitation electrode 34 is formed on the surface of one support portion 32 and extends from excitation electrode 34 to connection pad 37 formed on the upper surface of frame 33. Similarly, excitation electrode 35 is also formed on substantially the entire area of the other principal surface of crystal plate 31. Excitation electrode 35 is electrically connected to a connection pad (not shown), which is formed on the lower surface of frame 33, through an extending electrode (not shown) formed on the surface of the other support portion.

In the crystal resonator illustrated in FIGS. 5 and 6, crystal plate 31 is supported at two points. However, the number of support points and positions of stationary points where crystal plate 31 is supported can be arbitrarily determined, as long as crystal plate 31 is supported at stationary points $P_1$ to $P_4$ described above.

Figure 7:
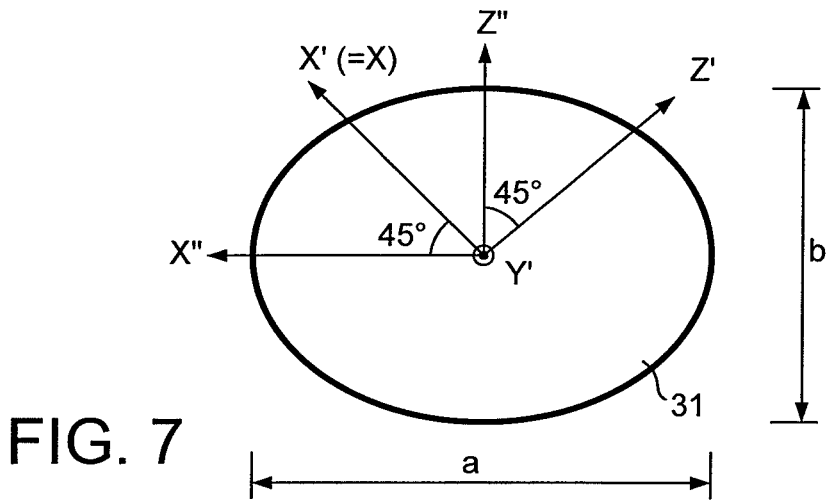
FIG. 7 is a diagram illustrating axis directions in a crystal plate.

FIG. 7 illustrates crystallographic orientations of axes in elliptical GT-cut crystal plate 31.

In the case of the GT-cut crystal plate, elastic coefficient $C'_{11}$ in the X"-axis direction and elastic coefficient $C'_{33}$ in the Z"-axis direction are equal to each other, and thus the same vibration characteristics are presented even when the dimensions in the X"-axis direction are replaced with the dimensions in the Z"-axis direction. That is, in the above description, the major axis corresponds to the X"-axis direction and the minor axis corresponds to the Z"-axis direction in the elliptical crystal plate. Alternatively, even when the major axis corresponds to the Z"-axis direction and the minor axis corresponds to the X"-axis direction, the same effects as those described above can be obtained.

Figure 8:
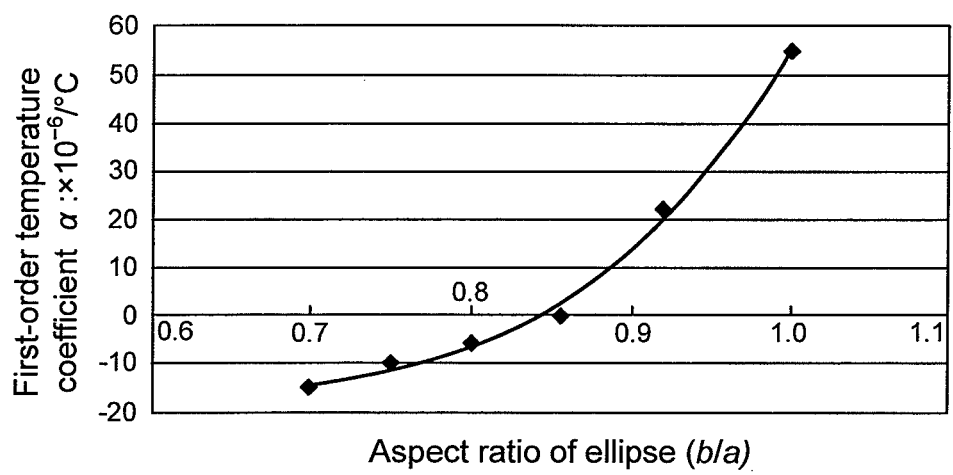
FIG. 8 is graph showing a relation between an aspect ratio of an elliptical GT-cut crystal resonator and a first-order temperature coefficient α of a frequency temperature characteristic thereof.

Next, as for the crystal resonator according to the present embodiment, a change in frequency temperature characteristic when the aspect ratio (b/a) of elliptical crystal plate 31 is changed will be described. FIG. 8 is a graph showing results obtained by examining a relation between the aspect ratio and a first-order temperature coefficient α. It is obvious that an excellent temperature characteristic can be obtained as long as the aspect ratio falls within the range of 0.75 to 0.90. The excellent temperature characteristic herein described indicates that the first-order temperature coefficient falls within the range of approximately ±10 ppm/° C.

The crystal resonator according to a aspect of the first embodiment has been described above. According to another aspect of the first embodiment, there is provided a crystal resonator including:

a crystal plate cut out from a crystal of quartz along a surface obtained by allowing a surface orthogonal to a Y-axis of the crystal of quartz to rotate about an X-axis by +51.5°; and a support portion that supports the crystal plate, wherein the crystal plate is formed in an elliptical shape with a major axis and a minor axis respectively corresponding to directions inclined by ±45° with respect to the X-axis within the surface of the crystal plate, and the support portion is connected to the crystal plate at a position on an outer periphery of the crystal plate where a minimum vibration displacement is obtained in coupling vibration modes obtained by coupling a longitudinal vibration mode in a direction of the major axis and a longitudinal vibration mode in a direction of the minor axis. Also in such a crystal resonator, the support portion may be made of quartz, and the crystal plate and the support portion may be integrally formed. Further, the length of the minor axis with respect to the length of the major axis is preferably set within the range of 0.75 to 0.90. Furthermore, an excitation electrode may be formed on each principal surface of the crystal plate.

By the way, a GT-cut crystal resonator has characteristics that equivalent series capacitance C1 becomes small and equivalent series resistance ESR becomes large, for example 1 kΩ, even if the excitation electrodes are formed as large as possible with respect to the plate surfaces of the crystal plate. The reason of this is that a resonance frequency of a GT-cut crystal resonator is determined in accordance with its outer dimensions. By this reason, it is not possible to adapt measures to enlarging the planar size of the crystal plate to reduce the equivalent series resistance. In a GT-cut crystal plate, for example, equivalent series capacitance C1 is approximately one third of that of the AT-cut crystal plate and equivalent series resistance ESR is approximately three times as large as that of an AT-cut crystal plate. As a result, when designing an oscillator circuit to which a GT-cut crystal resonator is connected, the circuit configuration to realize oscillation with high stability becomes complicated. In particular, oscillation margin of an oscillator circuit is reduced when equivalent series resistance of a crystal resonator is large.

A GT-cut crystal resonator with larger equivalent series capacitance and smaller equivalent series resistance will be described below.

Figure 9C:
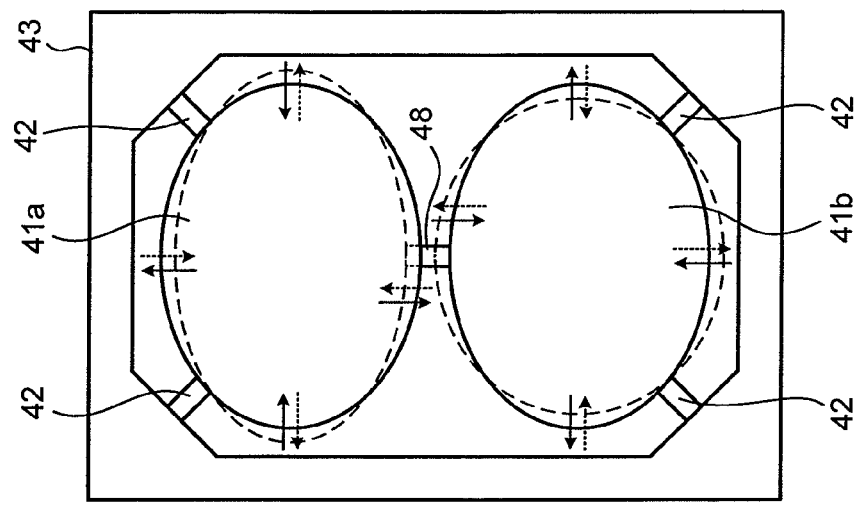
FIG. 9C is a diagram explaining a vibration state in the crystal resonator shown in FIG. 9A.
Figure 9B:
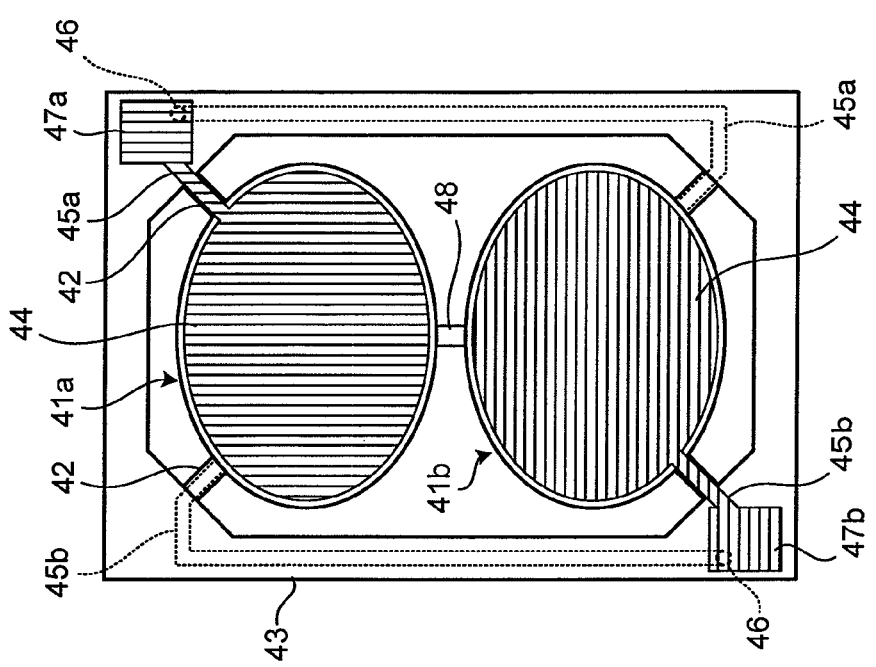
FIG. 9B is a diagram explaining wiring relationship between excitation electrodes in the crystal resonator shown in FIG. 9A.
Figure 9A:
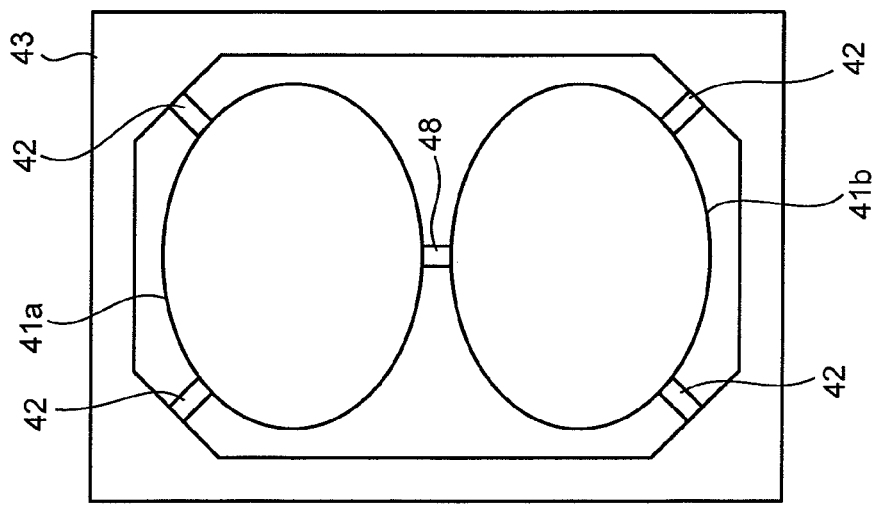
FIG. 9A is a plan view illustrating a GT-cut crystal resonator according to a second embodiment of the present invention.

The GT-cut crystal resonator according to the second embodiment shown in FIGS. 9A to 9C has two pieces of GT-cut crystal plates 41a and 41b each having a elliptical shape, each of which is similar to one shown in FIG. 4. The crystal resonator has a configuration in which crystal plates 41a and 41b are held in an opening of frame 43. The directions of a minor axis and a major axis of each of crystal plates 41a and 41b coincide with vibration directions of two longitudinal vibration modes in a quartz crystal of the GT-cut, respectively. The vibration directions are orthogonal to each other. The outer shapes of crystal plates 41a and 41b are identical to each other, and both crystal plates 41a and 41b have thus an identical resonance frequency in the vibration mode of the GT-cut.

Each of crystal plates 41a and 41b is supported by two rod-shaped support portions 42 extending from the inner wall of frame 43. Two support portions 42 for each crystal plate are mechanically connected to the corresponding crystal plate at two stationary points of above-mentioned four stationary points $P_1$ to $P_4$ located on the outer periphery of the elliptical crystal plate. The thickness of frame 43 is sufficiently greater than the thickness of crystal plates 41a and 41b.

Crystal plates 41a and 41b are disposed such that the minor axes of them are arranged along a straight line. Crystal plates 41a and 41b are mechanically coupled to each other by rod-shaped connection member 48. In particular, connection member 48 is connected to a point on the outer periphery of crystal plate 41a and to a point on the outer periphery of crystal plate 41b. Herein, one end of the minor axis of crystal plate 41a and one end of the minor axis of crystal plate 41b are connected to each other by connection member 48. However, it is possible to arrange crystal plates 41a and 41b such that the major axes of them are arranged along a straight line and connect one end of the major axis of crystal plate 41a with one end of the major axis of crystal plate 41b. It is not necessary to set the connection position of connection member 48 to the one end of the major or minor axis of the crystal plate. However, if the connection member is connected to the above-described stationary point on the periphery of the crystal plate, the significance of providing the connection member would be lost and both crystal plates would not be mechanically coupled.

Crystal plates 41a and 41b, support portions 42, frame 43 and connection member 48 are integrally formed by quartz. For example, it is possible to simultaneously and integrally form crystal plates 41a and 41b, support portions 42, frame 43 and connection member 48 by preparing a quartz crystal wafer of a GT-cut and applying an etching process using photolithography technology to the quartz crystal wafer. As a result, two crystal plates 41a and 41b are arranged within a plane formed by the vibration directions of the two longitudinal vibration modes of a GT-cut quartz crystal, and support portions 42 and connection member 48 are also arranged within the plane.

Here, it is assumed that one of two principle surfaces of a crystal plate, which appears in a plan view of a crystal resonator is a "top surface of the crystal plate" and the other principle surface which is arranged in a back side of the plan view is a "back surface of the crystal plate".

As shown in FIG. 9B, excitation electrode 44 is formed on substantially the entire area of each of two principal surfaces of each of crystal plates 41a and 41b. Excitation electrode 44 formed on the top surface of crystal plate 41a is electrically connected to the excitation electrode formed on the back surface of crystal plate 41b through conduction path 45a which is formed on the top surface of support portion 42 and frame 43. Electrode pad 47a for connecting this crystal resonator to an external circuit is also arranged in this conduction path 45a. Similarly, the excitation electrode formed on the back surface of crystal plate 41a is electrically connected to excitation electrode 44 formed on the top surface of crystal plate 41b through conduction path 45b which is formed on support portion 42 and frame 43. Electrode pad 47b for connection to the external circuit is arranged in conduction path 45b. Electrode pads 47a and 47b are formed on the top surface of frame 43. Through-holes 46 passing through frame 43 are arranged in conduction paths 45a and 45b because of necessity of electrically connecting the excitation electrode on the top surface with the excitation electrode on the back surface.

Since the excitation electrodes are electrically connected between crystal plates 41a and 41b in this manner, the respective electric polarities at crystal plates 41a and 41b upon excitation are reversed polarities to each other. Consequently, as shown in FIG. 9C, in the case where crystal plate 41a expands in the minor axis direction and contracts in the major axis direction, i.e., in the case shown by arrows of solid lines in the figure, crystal plate 41b expands in the major axis direction and contracts in the minor axis direction. On the other hand, in the case where crystal plate 41a expands in the major axis direction and contracts in the minor axis direction, i.e., in the case shown by arrows of dotted lines in the figure, crystal plate 41b expands in the minor axis direction and contracts in the major axis direction. When two crystal plates 41a and 41b oscillate in this manner, the spacing between both crystal plates 41a and 41b at the position of connection member 48 changes little. Therefore, connection member 48 mechanically couples both crystal plates 41a and 41 while it does not disturb vibration of the crystal plates. According to the present embodiment, since connection member 48 is provided, both crystal plates 41a and 41b integrally resonate at the same frequency and a high Q (quality factor) value as a crystal resonator can be obtained even in a situation where inherent resonance frequencies of those crystal plates are somewhat different from each other. If connection member 48 is not provided, the situation is electrically equivalent to a case where two crystal resonators having slight different resonance frequencies are connected in parallel and this causes reduction in the Q value as a whole.

In the crystal resonator according to the second embodiment, since each of crystal plates 41a and 41b is supported by support portions 42 at the points on an outer periphery of the crystal plate where a minimum vibration displacement is obtained, support portions 42 do not affect the vibration characteristics of crystal plates 41a and 41b. Connection member 48 mechanically couples both crystal plates 41a and 41 while it does not disturb vibration of the crystal plates. Since crystal plates 41a and 41b have the same resonance frequency, crystal plates 41a and 41b oscillate at this common resonance frequency. In addition, crystal plates 41a and 41b vibrate with stability in a single vibration mode which is coupled across both crystal plates, as a whole crystal resonator. As a result, this crystal resonator vibrates with very high stability without generating a spurious vibration.

In the crystal resonator according to the present embodiment, the area of excitation electrodes becomes twice as large as that of the crystal resonator shown in FIG. 4 while the resonance frequency is unchanged. Therefore, the equivalent series capacitance doubles and the equivalent series resistance is reduced by half when comparing to the crystal resonator shown in FIG. 4. When the GT-cut crystal resonator of the present embodiment is applied to an oscillator circuit, it is possible to obtain a large oscillation margin with a simple circuit configuration and construct an oscillation circuit with high stability because of smaller equivalent series resistance.

In the example shown in FIGS. 9A to 9C, one end of the minor axis of crystal plate 41a is mechanically coupled to one end of the minor axis of crystal plate 41b. However, in the case of the GT-cut crystal plate, elastic coefficient $C'_{11}$ in the X″-axis direction and elastic coefficient $C'_{33}$ in the Z″-axis direction are equal to each other, and thus the same effects as those described above can be obtained in a case where one end of the major axis of one crystal plate is mechanically coupled to one end of the major axis of the other crystal plate.

Next, a GT-cut crystal resonator according to the third embodiment of the present invention will be described.

Two crystal plates 41a and 41b are used to constitute a crystal resonator in the second embodiment. However, in the present invention, it is possible to use three or more GT-cut crystal plates to couple all the crystal plates into a single vibration mode by iteratively making mechanical coupling between two adjacent crystal plates.

Figure 10:
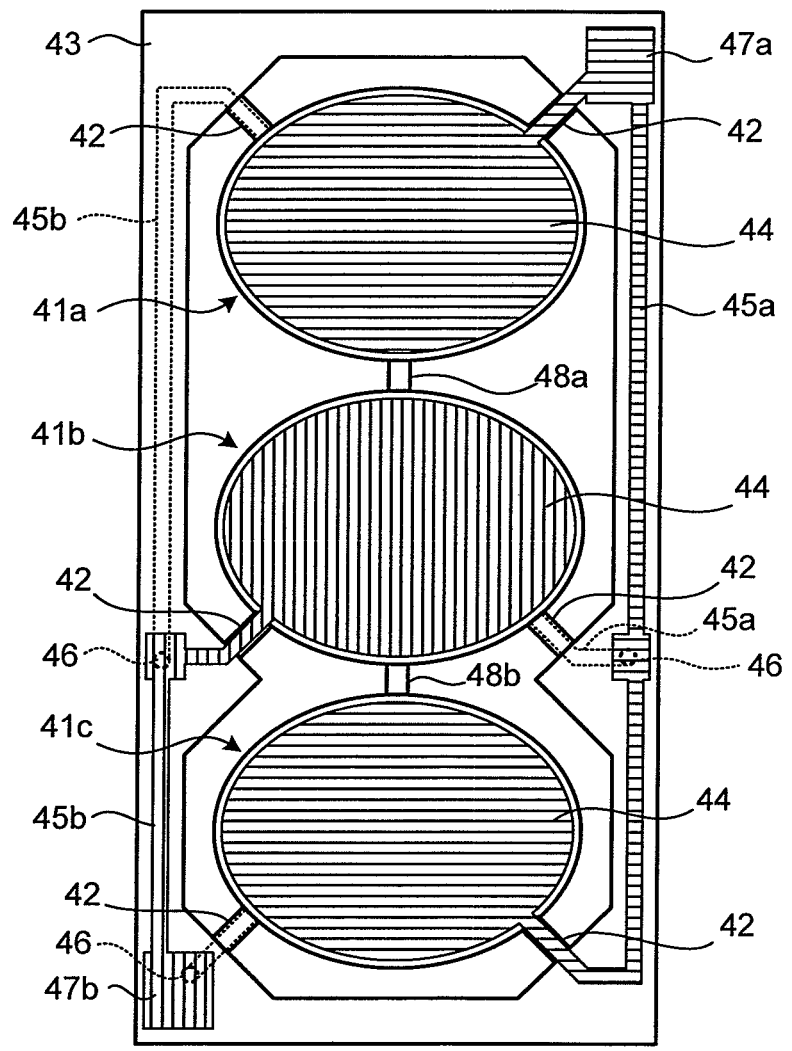
FIG. 10 is a plan view illustrating a GT-cut crystal resonator according to a third embodiment of the present invention.

The crystal resonator according to the third embodiment shown in FIG. 10 is similar to that shown in FIGS. 9A to 9C except that three crystal plates 41a to 41c are provided. Each of crystal plates 41a to 41c is connected to frame 43 by two rod-shaped support portions 42 which are provided for each crystal plate. Support portions 42 are connected to the corresponding crystal plate at the positions on an outer periphery of the crystal plate where a minimum vibration displacement is obtained. One end of the minor axis of crystal plate 41a is connected to one end of the minor axis of crystal plate 41b by rod-shaped connection member 48a, and the other end of the minor axis of crystal plate 41b is connected to one end of the minor axis of crystal plate 41c by rod-shaped connection member 48b. Therefore, crystal plates 41a and 41b are mechanically coupled to each other, and crystal plates 41b and 41c are also mechanically coupled to each other.

Excitation electrode 44 is formed on each of two principal surfaces of each of crystal plates 41a to 41c. The excitation electrodes formed on the top surfaces of crystal plates 41a and 41 and the excitation electrode formed on the back surface of crystal plate 41b are electrically connected to each other through conduction path 45a. Electrode pad 47a is also arranged in conduction path 45a. Similarly, the excitation electrodes formed on the back surfaces of crystal plates 41a and 41 and the excitation electrode formed on the top surface of crystal plate 41b are electrically connected to each other through conduction path 45b. Electrode pad 47b is also arranged in conduction path 45b. As a result, upon excitation of the crystal plates, crystal plates 41a and 41b are in a reverse polarity relation to each other, and crystal plates 41b and 41c are in a reverse polarity relation to each other. Crystal plates 41a and 41c are in the same polarity relation. As with the second embodiment, connection members 48a and 48b mechanically couple crystal plates 41a to 41c while they do not disturb vibration of the crystal plates. In the crystal resonator, crystal plates 41a to 41c oscillate at the common resonance frequency, and vibrate with stability in a single vibration mode which is coupled across crystal plates 41a to 41c, as a whole crystal resonator. In addition, in the crystal resonator according to the present embodiment, the area of excitation electrodes becomes three times as large as that of the crystal resonator shown in FIG. 4 while the resonance frequency is unchanged. Therefore, the equivalent series capacitance triples and the equivalent series resistance is reduced by one third when comparing to the crystal resonator shown in FIG. 4. When the GT-cut crystal resonator of the present embodiment is applied to an oscillator circuit, it is possible to obtain a large oscillation margin with a simple circuit configuration and construct an oscillation circuit with high stability.

A GT-cut crystal resonator according to the fourth embodiment of the present invention will be described below.

Figure 11:
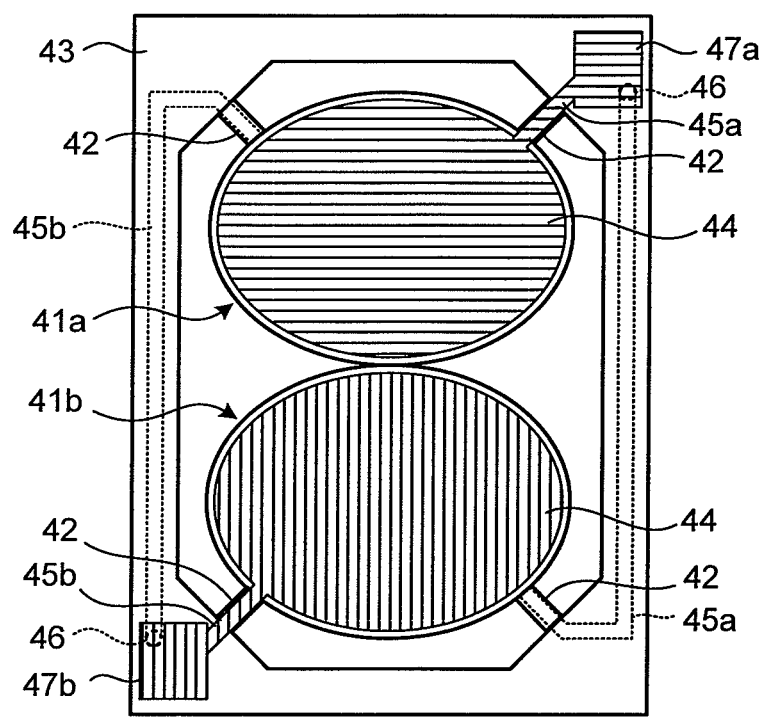
FIG. 11 is a plan view illustrating a GT-cut crystal resonator according to a fourth embodiment of the present invention.

In a crystal resonator according to the second embodiment, connection member 48 is arranged between adjacent crystal plates 41a and 41b to mechanically couple these crystal plates 41a and 41b. However, the manner of mechanical coupling between crystal plates is not limited to this. The crystal resonator according to the fourth embodiment as shown in FIG. 11 is similar to that of the second embodiment except that mechanical coupling between the crystal plates 41a and 41b is realized by directly joining one end of the minor axis of crystal plate 41a and one end of the minor axis of crystal plate 41b without arranging a connection member. Since crystal plates 41a and 41b are electrically excited in reverse polarities to each other as described above, no stress occurs at a joining location between crystal plates 41a and 41b when the crystal plates are directly joined. The crystal resonator according to the present embodiment has the similar advantageous effect as that of the second embodiment.

In a crystal resonator according to one of the second to fourth embodiments, a plurality of GT-cut crystal plates having the same resonance frequency are arranged, outer peripheries of adjacent two crystal plates are mechanically coupled to each other, and electric wirings are formed among the excitation electrodes so that, when one crystal plate of the two adjacent crystal plates expands in a first direction, the other crystal plate expands in a second direction which is orthogonal to the first direction. As a result, the plurality of the crystal plates are electrically connected in parallel with each other. Therefore, the equivalent series capacitance of the crystal resonator is increased and the equivalent series resistance is reduced as a whole in comparison to a crystal resonator including only one crystal plate. The crystal resonator according to one of the second to fourth embodiment has, for example, equivalent series resistance which is equivalent to that of an AT-cut crystal resonator. At the same time, the crystal plates are coupled to a single vibration mode as a whole by mechanically coupling the crystal plates and electrically connecting the excitation electrodes in the manner described above. As a result, the crystal resonator shows very high stability without generating a spurious vibration.

As with the first embodiment, it is preferable to set the aspect ratio (b/a) of each of elliptical crystal plates 41a to 41c within the range of 0.75 to 0.90 in the crystal resonator according to one of the second to fourth embodiments.

What is claimed is:
1. A GT-cut crystal resonator, comprising:
a crystal plate formed in an elliptical shape with a major axis and a minor axis respectively corresponding to vibration directions of two longitudinal vibration modes orthogonal to each other in a GT-cut; and a support portion that supports the crystal plate, the support portion being connected to a position on an outer periphery of the crystal plate where a minimum vibration displacement is obtained when the two longitudinal vibration modes are coupled.

2. The crystal resonator according to claim 1, wherein the support portion is made of quartz and is formed integrally with the crystal plate.

3. The crystal resonator according to claim 1, wherein the minor axis has a length in a range of 0.75 to 0.90 with respect to a length of the major axis.

4. The crystal resonator according to claim 1, further comprising an excitation electrode formed on each of principal surfaces of the crystal plate.

5. The crystal resonator according to claim 1, wherein
a plurality of the crystal plates are provided,
the crystal resonator further includes: a frame; and a pair of excitation electrodes respectively formed on both principle surfaces of each of the crystal plates,
the support portion is provided for each of the crystal plates and supports a corresponding crystal plate on the frame,
the plurality of crystal plates are arranged in a same plane including vibration directions of the two longitudinal vibration modes,
an outer periphery of one crystal plate of adjacent two of the crystal plates is mechanically coupled to an outer periphery of the other crystal plate of the adjacent two, and
electric wirings are formed among the excitation electrodes so that, when the one crystal plate expands in a first direction, the other crystal plate expands in a second direction which is orthogonal to the first direction.

6. The crystal resonator according to claim 5, wherein mechanical coupling between the outer peripheries of the one crystal plate and the other crystal plate is formed between one end of one of a major axis and a minor axis of the one crystal plate and one end of one of a major axis and a minor axis of the other crystal plate.

7. The crystal resonator according to claim 5, further comprising a connection member connected to the outer periphery of the one crystal plate and to the outer periphery of the other crystal plate, the connection member mechanically connecting the one crystal plate and the other crystal plates.

8. The crystal resonator according to claim 6, further comprising a connection member connected to the one end of one of a major axis and a minor axis of the one crystal plate and to the one end of one of a major axis and a minor axis of the other crystal plate, the connection member mechanically connecting the one crystal plate and the other crystal plates.

9. The crystal resonator according to claim 7 wherein the frame, the support portion and the connection member are made of quartz and are formed integrally with the crystal plates.

10. The crystal resonator according to claim 5, wherein the one crystal plate and the other crystal plates are mechanically coupled by directly joining a point on the outer periphery of the one crystal plate with a point on the outer periphery of the other crystal plate.

11. The crystal resonator according to claim 6, wherein the one crystal plate and the other crystal plates are mechanically coupled by directly joining the one end of one of a major axis and a minor axis of the one crystal plate with the one end of one of a major axis and a minor axis of the other crystal plate.

12. The crystal resonator according to claim 10, wherein the frame and the support portion are made of quartz and are formed integrally with the crystal plates.

13. The crystal resonator according to claim 5, wherein, in each of the crystal plates, the minor axis has a length in a range of 0.75 to 0.90 with respect to a length of the major axis.

* * * * *